United States Patent
Dubois et al.

(10) Patent No.: US 10,591,937 B2
(45) Date of Patent: Mar. 17, 2020

(54) MOTOR DRIVE ASSEMBLY

(71) Applicant: Hamilton Sundstrand Corporation, Charlotte, NC (US)

(72) Inventors: Fabien Dubois, Glanmire (IE); Tine Konjedic, Cork (IE)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 16/137,870

(22) Filed: Sep. 21, 2018

(65) Prior Publication Data
US 2019/0113941 A1  Apr. 18, 2019

(30) Foreign Application Priority Data
Oct. 16, 2017  (EP) ..................... 17196613

(51) Int. Cl.
| | |
|---|---|
| G05F 1/567 | (2006.01) |
| H02P 29/024 | (2016.01) |
| G01R 31/34 | (2020.01) |
| H02P 27/05 | (2006.01) |
| H02P 29/032 | (2016.01) |
| H02K 11/27 | (2016.01) |
| H02P 27/06 | (2006.01) |

(Continued)

(52) U.S. Cl.
CPC ......... G05F 1/567 (2013.01); G01R 31/1272 (2013.01); G01R 31/343 (2013.01); G01R 31/346 (2013.01); H02K 11/27 (2016.01); H02P 27/05 (2013.01); H02P 27/06 (2013.01); H02P 29/027 (2013.01); H02P 29/032 (2016.02); *G01R 19/16533* (2013.01); *G01R 31/42* (2013.01); *H02P 23/0004* (2013.01); *H02P 2205/01* (2013.01)

(58) Field of Classification Search
CPC ..... G01R 31/1272; H02K 11/27; H02P 27/06; H02P 29/027
See application file for complete search history.

(56) References Cited

U.S. PATENT DOCUMENTS

2005/0012507 A1*  1/2005  Kaneda ................ G01R 31/343
                                                          324/536
2009/0198397 A1  8/2009  Matsumoto
(Continued)

FOREIGN PATENT DOCUMENTS

DE  102010010396 A1  9/2011
JP      2005274440 A  10/2005
(Continued)

OTHER PUBLICATIONS

Extended European Search Report for International Application No. 17196613.8 dated Apr. 17, 2018, 9 pages.

(Continued)

*Primary Examiner* — Karen Masih
(74) *Attorney, Agent, or Firm* — Cantor Colburn LLP

(57) ABSTRACT

A motor system is disclosed comprising: an electrical conductor in the form of a coil or winding; an electrical insulator insulating the electrical conductor; a discharge sensor arranged and configured to measure a parameter indicative of an electrical current in the insulator; and a voltage controller for controlling a voltage signal applied to the electrical conductor based on a value of the parameter measured by the discharge sensor.

13 Claims, 2 Drawing Sheets

(51) Int. Cl.
*G01R 31/12* (2020.01)
*G01R 19/165* (2006.01)
*H02P 23/00* (2016.01)
*G01R 31/42* (2006.01)

(56) References Cited

U.S. PATENT DOCUMENTS

2010/0295494 A1  11/2010  Takeuchi et al.
2012/0217922 A1  8/2012   Sato et al.
2014/0139268 A1  5/2014   Bayerer
2017/0184656 A1  6/2017   Nett et al.

FOREIGN PATENT DOCUMENTS

| JP | 2008022624 A | 1/2008 |
| JP | 2010004665 A | 1/2010 |
| JP | 2017011808 A | 1/2017 |

OTHER PUBLICATIONS

Álvarez, et al. "Application of HFCT and UHF Sensors in On-Line Partial Discharge Measurements for Insulation Diagnosis of High Voltage Equipment" Sensors 2015, 15, 7360-7387.

* cited by examiner

MOTOR DRIVE ASSEMBLY

FOREIGN PRIORITY

This application claims priority to European Patent Application No. 17196613.8 filed Oct. 16, 2017, the entire contents of which is incorporated herein by reference.

FIELD

The present disclosure relates generally to a system for controlling the voltage applied to an electrical conductor, such as a motor drive assembly for applying a voltage to a motor winding.

BACKGROUND

Electric motor systems are known in which windings on a stator are powered by a DC to AC converter, such that the windings generate magnetic fields that cause a rotor to rotate. The windings are electrically insulated by insulators. However, electrical charges build-up on the surfaces of insulating material during use, causing a high electric field to build up and an electrical breakdown to subsequently occur. Such an electrical breakdowns generate a relatively large amount of heat, which degrades the insulation material.

It is possible to use high performance insulating materials and configurations to prevent or reduce this problem. However, such techniques increase the size, cost and/or complexity of manufacturing the motor system.

SUMMARY

A first aspect of the present disclosure provides a system comprising: a discharge sensor configured to measure a parameter indicative of an electrical current in an electrical insulator of an electrical conductor; and a voltage controller for being connected to the discharge sensor for controlling a voltage signal applied to the electrical conductor based on a value of the parameter measured by the discharge sensor.

The voltage controller may be connected to the discharge sensor.

The system may further comprise said electrical conductor and said electrical insulator of the electrical conductor.

The electrical conductor may be a wire coil or winding.

The discharge sensor may be an inductive or capacitive detector for detecting the electrical current in the electrical insulator. Alternatively, the discharge sensor may be another type of sensor, such as an optical sensor, vibration sensor or temperature sensor which outputs a signal indicative of (e.g. proportional to) the electrical current in the electrical insulator.

The voltage controller may be configured to control the rate of change of amplitude of the voltage signal applied to the electrical conductor with time (dV/dt) based on the value of the parameter measured by the discharge sensor.

The voltage controller may be configured to decrease said rate (dV/dt) if the value of the parameter measured by the discharge sensor is above a first set-point value and/or to increase said rate (dV/dt) if the value of the parameter measured by the discharge sensor is below a second set-point value.

The first and second set-point values may be the same or different.

The system may comprise an environment sensor for sensing one or more parameters of the environment in which the electrical insulator is located; wherein the system is configured to set said first and/or second set-point value based on the value of the one or more parameters of the environment.

The one or more parameters of the environment may be one or more of: pressure, temperature and humidity.

The system may continually or discontinuously (e.g. periodically) monitor the one of more parameters of the environment and set the first and/or second set-point based on the sensed value(s).

The voltage controller may comprise: an error detector, a compensator and a gate drive unit for controlling the rate of change of amplitude of the voltage signal applied to the electrical conductor with time (dV/dt); wherein the error detector is configured to compare a sensor signal from the discharge sensor to one or more set point signal defining said first and/or second set-point value and to generate an error signal in response thereto; and wherein the compensator is configured to send a command to the gate drive unit based on the error signal such that the gate drive unit varies the rate (dV/dt) applied to the electrical conductor.

The error signal may have a value that is based on the difference between the sensor signal and the set point signal.

The voltage controller may be configured such that the gate drive unit is commanded to vary the rate (dV/dt) in a manner such that the sensor signal will approach or reach the set-point signal.

The system may comprise a dV/dt sensor arranged and configured to determine the rate (dV/dt) output from the voltage controller to the electrical conductor and generate a feedback signal in response thereto, wherein the feedback signal is fed back to the voltage controller for regulating the rate (dV/dt) of the voltage output to the electrical conductor.

The voltage controller comprises at least a first switch, optionally a semiconductor switch, for gating the voltage signal applied to the electrical conductor. The switch may be a transistor.

The voltage controller may comprise a signal limiter for limiting the rate (dV/dt) to be between a minimum non-zero threshold value and/or a maximum threshold value.

The minimum threshold value may be a fixed predetermined value, or may be varied as will be described further below.

The voltage controller may comprise an output connected to the electrical conductor, a first switch (i.e. first gate) for connecting a first DC voltage terminal to the output when closed, and a second switch (i.e. second gate) for connecting a second DC voltage terminal to the output when closed; wherein the voltage controller is configured to alternately open and close each of the first and second switches for providing an AC voltage signal to said output and winding.

The first DC voltage terminal may be a positive DC voltage terminal and the second DC voltage terminal may be a negative DC voltage terminal or a ground DC voltage terminal. Alternatively, the first DC voltage terminal may be a negative DC voltage terminal and the second DC voltage terminal may be a ground DC voltage terminal.

The system may further comprise a DC voltage supply having said positive, negative, or ground DC voltage terminals.

The voltage controller may be configured to control the opening and/or closing of the first switch based on the electrical current measured by the discharge sensor; and/or may be configured to control the opening and/or closing of the second switch based on the electrical current measured by the discharge sensor.

The first switch and/or second switch may comprise a transistor that is opened and closed by varying a switching voltage applied to the transistor; and the voltage controller may be configured to vary the rate at which the switching voltage increases or decreases during opening or closing of the switch as a function of time based on the electrical value of the parameter measured by the discharge sensor.

The first and second switches may be semiconductor switches, such as MOSFET or IGBT devices.

The voltage controller may comprise a signal limiter for limiting the rate (dV/dt) to be at or above a minimum non-zero threshold value; and the system may comprise a temperature sensor for sensing a temperature of the first and/or second switch in the voltage controller, or a surrounding environment, and may be configured to vary the minimum threshold value based on the sensed temperature.

The voltage controller may be configured to control the rate of change of amplitude of the voltage signal applied to the electrical conductor with time (dV/dt) based on the value of the parameter measured by the discharge sensor; the system may comprise a temperature sensor for sensing a temperature of the first and/or second switch in the voltage controller, or a surrounding environment, and the system may be configured to prevent the rate (dV/dt) being reduced if said temperature exceeds a predetermined maximum value.

The system may comprise a moveable member arranged and configured to be moved by a magnetic field generated when the voltage is applied to the electrical conductor. For example, the moveable may be a rotor that is driven by the magnetic field.

The system may be a motor having the movable member therein.

The system may comprise a further voltage controller corresponding to that described above, wherein outputs of the different voltage controllers supply opposing ends of the electrical conductor with AC voltages, and wherein the AC voltages supplied by the different voltage controllers may be out of phase.

The outputs of the voltage controllers may be directly connected to the two ends of the electrical conductor. Alternatively, one of the voltage controllers may be connected to one end of the electrical conductor, the other end of the electrical conductor may be connected to a first end of a second electrical conductor, and the second end of the second electrical conductor may be connected to the other voltage controller. The second electrical conductor may have a second electrical insulator associated therewith and a second discharge sensor may be provided for sensing a parameter indicative of the electrical current in that second electrical insulator. The signal from the second discharge sensor may be used for controlling the voltage applied to the second electrical conductor in a corresponding manner to that described above.

Arrangements having more than two electrical conductors and more than two voltage controllers are also contemplated.

From another aspect the present disclosure provides an assembly comprising an electrical conductor, an electrical insulator for electrically insulating the electrical conductor, and a discharge sensor arranged in, on or proximate the electrical insulator and configured to measure a parameter indicative of an electrical current in an electrical insulator.

The assembly may have any of the optional features described in relation to the system of the first aspect of the present disclosure.

From another aspect the present disclosure provides a motor or actuator comprising the system or assembly described herein.

For example, an actuator may be provided wherein the movable member of the system (that is moved by applying the voltage to the electrical conductor) may be coupled to a load. The load may be selectively moved by selectively applying a voltage to the electrical conductor.

From another aspect the present disclosure provides a method of installing the system described herein comprising: arranging the discharge sensor in, on or proximate the electrical insulator of an electrical conductor; and connecting the voltage controller to the discharge sensor.

From another aspect the present disclosure provides a method of installing the assembly described herein, comprising arranging the assembly in a motor.

From another aspect the present disclosure provides a motor system comprising: an electrical conductor in the form or a coil or winding; an electrical insulator insulating the electrical conductor; a discharge sensor arranged and configured to measure a parameter indicative of an electrical current in the insulator; and a voltage controller for controlling a voltage signal applied to the electrical conductor based on a value of the parameter measured by the discharge sensor.

The voltage controller controls the opening and closing of a gate (i.e. at least one switch) that connects the output of the voltage controller to a voltage supply. The voltage controller may therefore the energising of the electrical conductor, which may be arranged on a stator of the motor for driving a rotor of the motor.

BRIEF DESCRIPTION OF THE DRAWINGS

Various embodiments will now be described, by way of example only, and with reference to the accompanying drawings in which.

DETAILED DESCRIPTION

Embodiments of the present disclosure will now be described with reference to an electric motor, e.g. a brushless motor.

Figure 1:
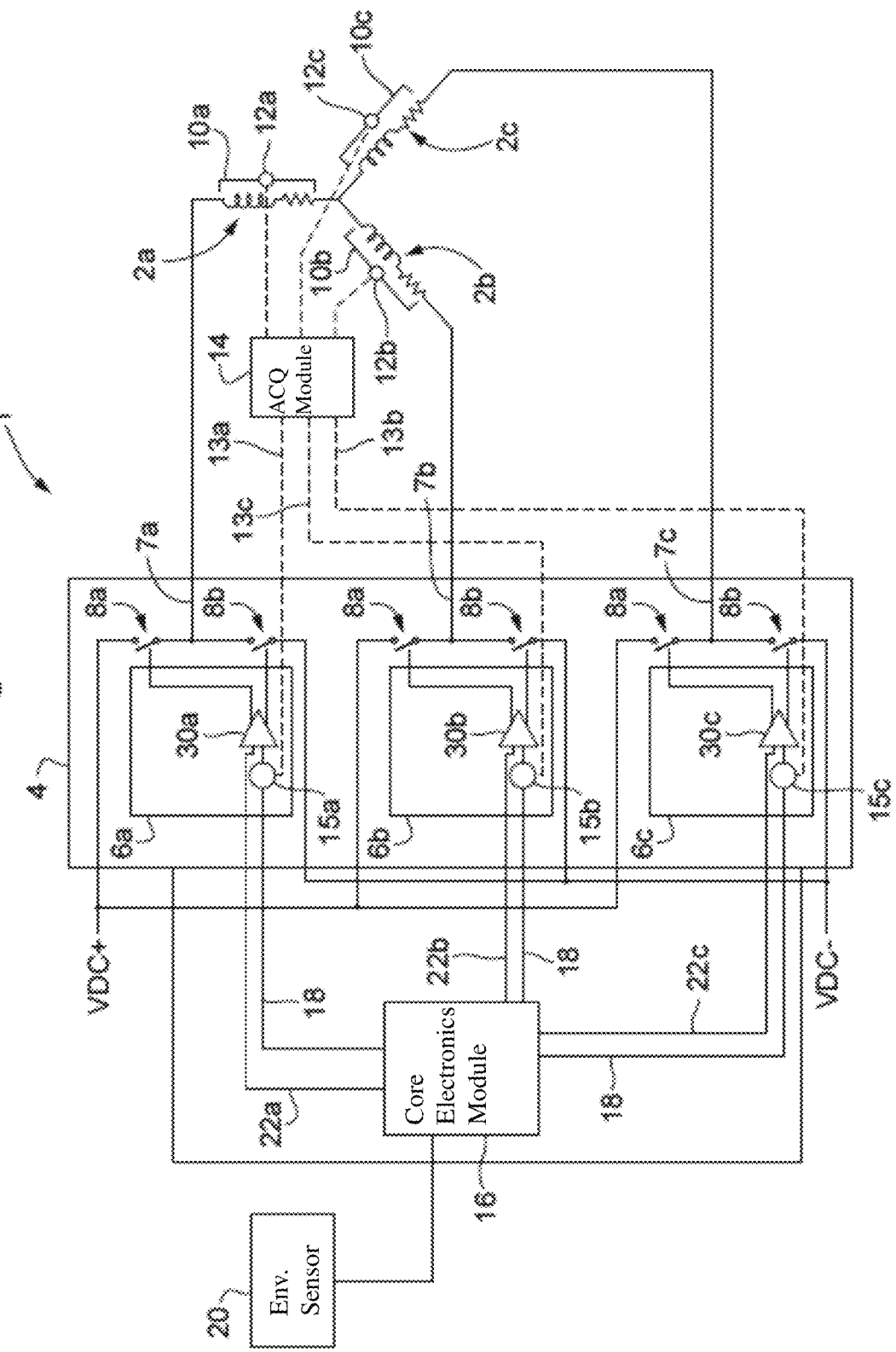
FIG. 1 shows a schematic of a motor system according to an embodiment of the present disclosure.

FIG. 1 shows a schematic of a motor drive system 1 according to an embodiment of the present disclosure. The motor drive system is coupled to electrical conductors in the form of stator windings 2a-2c of an electric motor, such as a brushless motor. The system comprises a DC to AC converter 4 configured to receive a DC voltage supply and output an AC voltage supply to the motor windings 2a-2c. More specifically, the DC to AC converter 4 comprises a plurality of voltage controllers in the form of gate driver modules 6a-6c. Opposing ends of each winding 2a-2c are electrically connected to the outputs 7a-7c of different ones of the gate driver modules 6a-6c. For example, one end of a first winding 2a is connected to the output 7a of a first gate driver module 6a and a second end of the first winding 2a is connected to the output 7b of a second gate driver module 6b (in this embodiment via a second of the windings 2b). Each gate driver module 6a-6c comprises a first switch 8a that is switchable between a first state in which it connects the output 7a-7c of that gate driver module 6a-6c to the positive terminal (VDC+) of a DC voltage supply, and a second state in which it disconnects the output 7a-7c of that gate driver module 6a-6c from the positive terminal of the DC voltage supply. Each gate driver module 6a-6c also comprises a second switch 8b that is switchable between a first state in which it connects the output 7a-7c of that gate driver module 6a-6c to the negative terminal (VDC−) of the DC voltage supply, and a second state in which it disconnects the output 7a-7c of the gate driver module 6a-7c to the negative terminal of the DC voltage supply.

Each gate driver module 6a-6c is configured so that its first and second switches 8a,8b operate to alternately supply the output 7a-7c with positive and negative voltages, such that an AC voltage is output to the end of the winding 2a-2c to which it is (directly) connected. As mentioned above, different gate driver modules 6a-6c are connected to the opposing ends of each winding 2a-2c, and the first and second switches 8a,8b within each of these modules 6a-6c are controlled as a function of time such that (for at least some of the time) a potential difference occurs across the winding 2a-2c that generates a magnetic field that urges the rotor (or other moving part) in the motor to move. The gate driver modules 6a-6c may be configured to repeatedly energise each winding 2a-2c to generate the magnetic field that urges the rotor. The gate driver modules 6a-6c may be configured so that at least some of the windings 2a-2c are energised out of phase from each other, and at times that are optimal to urge the rotor (or other moving part), as is known in the art.

In the depicted embodiment, three motor windings 2a-2c are provided that are electrically connected to each other by one of their ends and at a common point, and a different gate driver module 6a-6c is connected to the other end of each winding 2a-2c. However, other configurations are contemplated with different winding configurations and/or with different numbers of windings 2a-2c and different numbers of gate driver modules 6a-6c.

Alternatively, or additionally, although the electrical terminals have been described as being positive and negative terminals, it is contemplated that the positive terminal (VDC+) or the negative terminal (VDC−) may be a ground terminal (e.g. at 0V).

Each of the motor windings 2a-2c is electrically insulated by an electrical insulator 10a-10c, e.g. which may be wound around the winding 2a-2c or formed around the wire that is coiled to make the winding 2a-2c. However, it has been recognised that this insulator 10a-10c may degrade during use of the motor. More specifically, electrical charges build-up within the insulator 10a-10c, such as on surfaces of insulating material that separate different portions of the windings 2a-2c (or separating different windings 2a-2c). This charge build up may result in a relatively high electric field being generated, which may then electrically discharge in an electrical breakdown. For example, if the electric field is generated in a weak region of the insulator 10a-10c (e.g. in a region having a lower relative permeability than the insulator material itself), such as between layers of insulation material, then an electrical breakdown may occur in this region. Such an electrical breakdown generates a relatively large amount of heat, which may degrade the insulation material. The rate of such degradation increases when the relative permittivity of the ambient environment varies (e.g. decreased humidity, increased temperature, or increased pressure) and/or when the rate of change of the phase voltage supplied by the DC-AC converter 4 to the winding 2a-2c increases.

The rate of change of the phase voltage supplied to the winding 2a-2c may be reduced, so as to reduce the rate of insulator 10 degradation caused by the above-mentioned electrical (partial) discharge. However, this increases losses in the DC-AC converter 4 of the motor drive 1 and may also necessitate more demanding thermal management requirements in the DC-AC converter 4. For example, the DC-AC converter 4 may comprise semiconductor components, such as the switches 8a,8b, and the losses may increase the failure rate of these semiconductors. It is also possible to use high performance insulator 10 materials and configurations to prevent or reduce the electrical discharge in the insulator 10. However, such techniques may increase the size, cost and/or complexity of manufacturing the motor.

Embodiments of the present disclosure are configured to reduce degradation of the insulator 10a-10c around the motor windings 2a-2c, whilst minimising losses in the motor drive system 1 and particularly in the DC-AC converter 4.

Referring back to FIG. 1, embodiments of the present disclosure comprise a discharge sensor 12a-12c arranged and configured for measuring a parameter indicative of the discharge current flowing in the insulator 10a-10c of each motor winding 2a-2c as a result of the electrical breakdown described above. A discharge sensor 12a-12c may be provided for at least one, or optionally all, of the motor windings 2a-2c. As described above, the discharge current may be a function of the relative permittivity of the ambient environment (e.g. humidity, temperature, or pressure), the rate of change of the phase voltage supplied to the winding 2a-2c, or the location of the sensor 12a-12c relative to the winding 2a-2c. The discharge sensor 12a-12c may be, for example, a capacitive sensor or an inductive sensor. Suitable discharge sensors are known in the art and will not be described further herein. An example of a discharge sensor can be found in F. Alvarez, "Application of HFCT and UHF Sensors in On-Line Partial Discharge measurements for Insulation Diagnosis of High Voltage Equipment", Sensors 2015, 15, 7360-7387 (ISSN 1424-8220). Alternatively, the discharge sensor may be another type of sensor, such as an optical sensor, vibration sensor or temperature sensor which outputs a value (i.e. signal) indicative of (e.g. proportional to) the electrical current in the electrical insulator.

An acquisition electronics module 14 is provided to receive the signal from each discharge sensor 12a-12c. The discharge current in each winding insulator 10a-10c may be a high frequency signal, and so the signal resulting from the discharge current that is sensed by each discharge sensor 12a-12c may be integrated (e.g. using a low pass filter) by the acquisition electronics module 14 in order to generate an output signal 13a-13c indicative of the amount of charge flowing through the winding insulator 10a-10c. The output signal 13a-13c is then fed to a regulator 15a-15c in the gate driver module 6a-6c that supplies the AC voltage to the winding 2a-2c associated with that discharge sensor 12a-12c. The regulator 15a-15c may be, for example, implemented within a dedicated microcontroller or within a programmable logic device (e.g. FPGA and CPLD). If the regulator 15a-15c is implemented digitally, then it may be provided within the core electronics module 16. Signals from other sensors are available here already and so the output of discharge sensor 12a-12c would be just another sensed variable.

A core electronics module 16 supplies a set-point signal 18 to the regulator 15a-15c, which may indicate the maximum discharge current to be permitted in the winding insulator 10a-10c. The set-point signal 18 may be set based on the optimized trade-off between the level of losses in the DC-to-AC converter 4 (e.g. causing aging of solid state components such as the switches 8a,8b) and the level of discharge current in the winding insulators 10a-10c (i.e. aging of the motor).

The level of the set-point signal 18 may be set based on the pressure and/or temperature and/or humidity in which the winding insulator 10a-10c is located. An environment sensor 20 may be provided so as to monitor this pressure and/or temperature and/or humidity, and may be used to control the value of the set-point signal 18 based on the sensed pressure and/or temperature and/or humidity. It is contemplated that the pressure and/or temperature and/or humidity may be sensed and provided to the electronics module 16 by components that are dedicated to the motor drive system. Alternatively, signals associated with the sensed values of pressure and/or temperature and/or humidity may be provided by a non-dedicated electronic control unit and communicated to the electronics module 16, for example, by a common bus. Sensing and using such parameters is useful when the winding insulator 10a-10c is located in environmental conditions that may change significantly over time, for example, in an aircraft. The regulator 15a-15c compares the signal 13a-13c from the acquisition electronics module 14 (that is indicative of the discharge current in the winding insulator 10a-10c) with the set-point signal 18 and controls the switching in the gate driver module 6a-6c in response thereto (via the gate drive unit 30a-30c), as will be described in more detail in relation to FIG. 2. The core electronics 16 may also supply a pulse modulation width signal 22a-22c to the gate driver module 6a-6c for controlling the switches 8a,8b therein.

Figure 2:
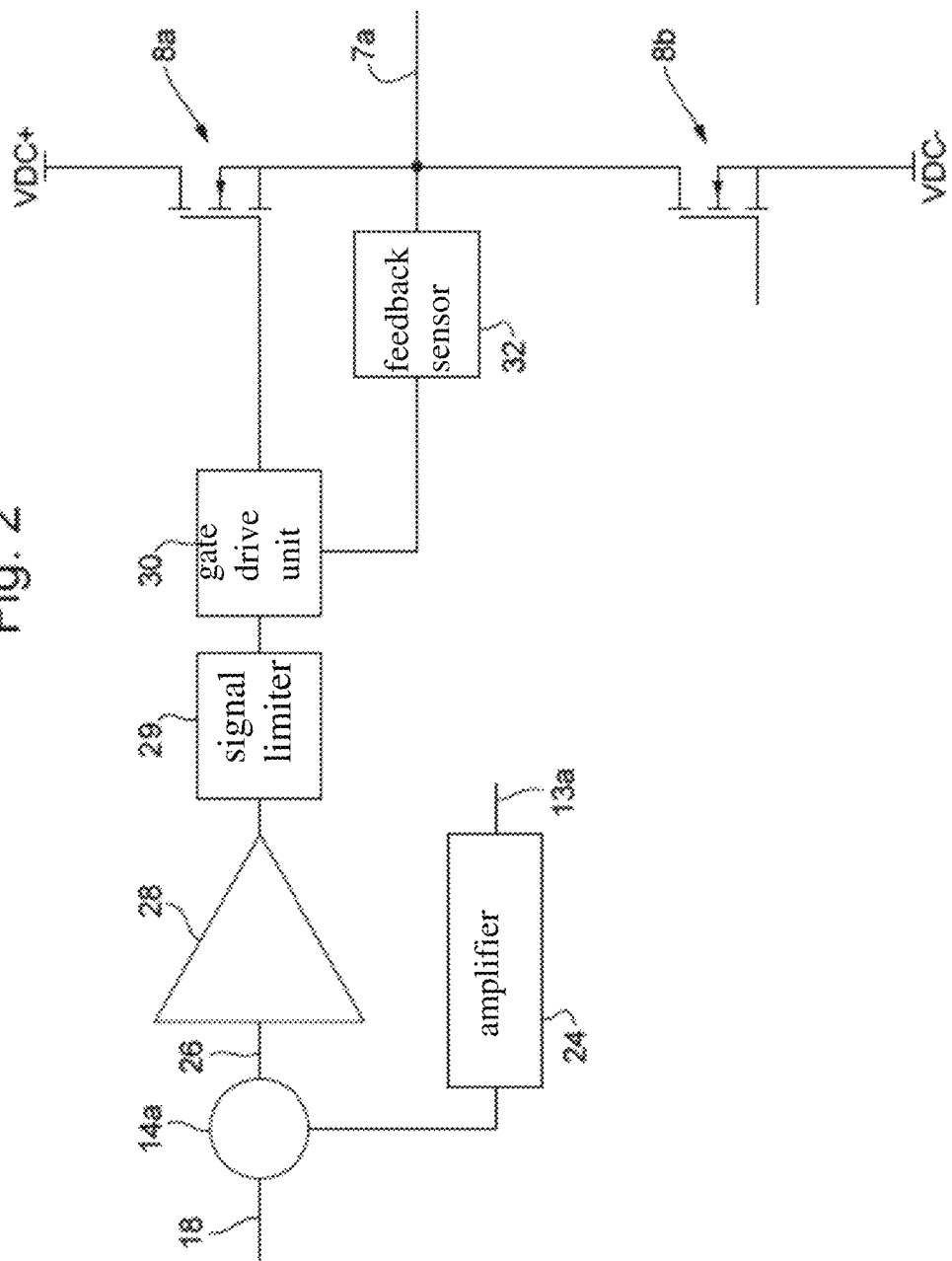
FIG. 2 shows a schematic of part of the electronics in the gate driver module of FIG. 1.

FIG. 2 shows a schematic of part of the electronics in one of the gate driver modules 6a of FIG. 1. FIG. 2 shows the first and second switches 8a,8b of the gate driver module 6a, although for ease of illustration only shows the electronics associated with the first switch 8a. It will be appreciated that corresponding electronics are associated with the second switch 8b. In this embodiment the first and second switches 8a,8b are transistor switches, such as MOSFET switches, although it is contemplated that other types of switches may be used. It will also be appreciated that the other gate driver modules 6b,6c include corresponding electronics.

As described above, the first and second switches 8a,8b are controlled so that output 7a of the gate driver module 6a (i.e. the output of the voltage controller) is alternately coupled to the positive terminal (VDC+) of the DC voltage and the negative terminal (VDC−) of the DC voltage supply. The opening and closing of each of the first and second switches 8a,8b is controlled by the gate drive unit 30 such that an appropriate AC voltage is supplied to the output 7a of the gate drive module 6a, and hence to the winding 2a connected thereto. The core electronics 16 supply a pulse width modulation signal 22a (shown in FIG. 1) to the gate drive unit 30, which sets the frequency with which the gate drive unit 6a opens and closes each switch 8a,8b. The gate drive unit 30 also controls the switches 8a,8b so as to control the rate of change of the phase voltage supplied to the winding 2a with respect to time (dV/dt). As described above, it is desired for the value of dV/dt to be relatively high such that losses in the gate drive module 6a are relatively low, but such high values of dV/dt may cause deterioration of the winding insulator 10a. Embodiments of the present disclosure control the rate of change of the phase voltage (dV/dt) to reduce the deterioration of the insulator 10a, as will be described below.

As described above, the acquisition module 14 sends a signal 13a to the gate driver module 6a (i.e. voltage controller) that is indicative of the discharge current in the insulator 10a of the winding 2a that is (directly) connected to that gate driver module 6a. As has been described, the signal 13a is sent to an error detector 14a in the gate driver module 6a, although it may first be amplified by an amplifier 24. The error detector 14a also receives the set-point signal 18 from the core electronics module 16. The error detector 14a generates an error signal 26 based on the two received signals 13a,18. An error signal 26 will therefore be generated when the signal 13a from the discharge sensor 12a associated with a winding 2a indicates that the discharge current in the respective insulator 10a of that winding 2a is higher than permitted by the set-point signal 18. The error signal 26 may be an analogue voltage signal. The error signal 26 then is fed to a compensator 28, which controls the gate drive unit 30 based on the value of the error signal 26 received at the compensator 28, to vary the rate of change of the phase voltage (dV/dt). For example, if it is determined that the current in the winding insulator 10a is higher than the maximum acceptable current set by the set point signal 18 then the comparator 14a will generate an error signal 26 indicative of this and the compensator 28 will control the gate drive unit 30 to reduce the rate of change of the phase voltage (dV/dt). Conversely, if it is determined that the current in the winding insulator 10a is lower than the maximum acceptable current set by the set point signal 18 then the error detector 14a will generate an error signal 26 indicative of this and the compensator 28 will control the gate drive unit 30 to increase the rate of change of the phase voltage (dV/dt).

The manner in which the rate of change of the phase voltage (dV/dt) is varied will be well understood by the skilled person. This may be varied by varying the voltage applied to the semiconductor switch 8a (e.g. MOSFET) by the gate drive unit 30. For example, as the voltage applied to the switch 8a increases, the current permitted to flow through the switch to the winding 2a also increases until it reaches a saturation level and the intrinsic region of the semiconductor behaves like a capacitor having a capacitance. The dV/dt may be controlled by controlling the voltage applied to the switch 8a (e.g. through a certain gate impedance) in order to control the rate of discharge of the intrinsic region capacitance to the winding 2a. Although a MOSFET switch has been described, other types of semiconductor switches may be used, such as an Insulated Gate Bipolar Transistor (IGBT).

Optionally, a signal limiter 29 may be provided between compensator 28 and gate drive unit 30 for limiting the signal passed from the comparator 28 to the gate drive unit 30 to be between a minimum threshold value and a maximum threshold value. This may be used to protect the switch 8a from overheating and to prevent different failures associated with a very high dV/dt. For example, the maximum threshold value may be selected such that the gate drive unit 30 can only increase the value of dV/dt to a maximum value, which may be the dV/dt value that provides safe operation and highest performance (efficiency) of the DC-AC converter 4 (in normal operating conditions). The minimum threshold value may be selected such that the gate drive unit 30 can only decrease the value of dV/dt to a minimum value, which may be the lowest acceptable dV/dt value (e.g. the dV/dt value that corresponds to the maximum allowed power dissipation in the switch 8a). The lowest acceptable dV/dt (and hence the minimum threshold value) may be a fixed predetermined value, e.g. that is defined during design of the system, or alternatively may be varied based on a temperature measurement of the switch 8a or its surrounding environment. The latter implementation requires a temperature sensor associated with the switch 8a.

As described herein, reducing the dV/dt may be used to protect the winding insulator 10a from deterioration, but increases the power dissipation in the switch 8a. Embodiments are contemplated which control the value of dV/dt so as to prioritise the protection of the switch 8a over the protection of the insulator 10a. In these embodiments, the temperature of the switch 8a or its surrounding environment is measured and if the temperature exceeds a predetermined maximum allowed value, the dV/dt may be controlled so as not to decrease any further, despite the risk of irreversible damage to the winding insulator 10a. This may result in the winding insulator 10a eventually failing, but the switch 8a in the DC-AC converter 4 would not suffer any significant damage and would remain available for supplying other motor windings 2a-2c in the system. Accordingly, the fact that the DC-AC converter 4 survives is beneficial from a system availability aspect in configurations in which one DC-AC converter supplies multiple loads or windings 2a-2c. If one load is damaged (motor winding insulation breakdown), other loads are still functional.

The voltage controller described herein may be a predictive controller that may use a plurality of the considerations described herein to determine how the dV/dt is controlled. For instance, the controller may use a plurality of weighted cost functions to determine how the dV/dt is controlled. Examples of such cost functions include the temperature of the motor winding 2a-2c and the desired performance (efficiency) of the DC-AC converter 4. This control may be implemented in electronic core 16.

It will be appreciated that the regulator 15a in FIG. 1 comprises the error detector 14a and compensator 28 shown in FIG. 2. The gate drive unit 30a in FIG. 1 represents the gate drive unit 30 of FIG. 2. In the depicted embodiment the regulator 15a is implemented by an analogue circuit (i.e. comprising error detector 14a and the compensator 28) within the gate drive module 6a. However, it is contemplated herein that the circuit may alternatively be a digital circuit and may be located elsewhere, e.g. within the digital core 16. Similarly, the signal limiter 29 may be provided within the digital core 16.

A dV/dt feedback sensor 32 may optionally be provided to determine the rate of change of the phase voltage (dV/dt) at the output 7a of the gate driver module 6a. This feedback sensor 32 may form a closed control loop with the gate drive unit 30 so as to regulate the rate of change of the phase voltage (dV/dt), e.g. the phase voltage signal shape dictated by the gate drive 30. Any suitable control system may be used to assist in control of the rate of change of the phase voltage (dV/dt) in this regulatory manner. For example, a PID control system or a hysteresis control system may be used. It is alternatively contemplated that an open loop dV/dt control system may be implemented.

Although the operation of only the first switch 8a of the gate driver module 6a has been described, it will be appreciated that the second switch 8b of the gate driver module 6a may be controlled in a corresponding manner, although out of phase with the first switch 8a such that the output 7a is provided with an AC voltage signal. Similarly, the other gate driver modules 6b,6c may operate in a corresponding manner based on feedback from the discharge sensors 12b,12c that are associated with the insulators 10b,10c of their respective windings 2b,2c that the gate driver modules 6b,6c are (directly) connected to.

It will therefore be appreciated that the rate of change of the phase voltages (dV/dt) supplied to each winding 2a-2c may be varied based on the electrical discharge current detected in the winding insulator 10a-10c. This allows the rate of change of the phase voltages (dV/dt) to be optimised, e.g. to reduce losses and reduce deterioration of the insulators 10a-10c. The embodiments therefore allow for improved reliability and increased lifetime of the motor and its drive system.

Furthermore, controlling the rate of change of the phase voltages (dV/dt) based on the discharge current detected in the insulators 10a-10c enables the system to react to variations in the operating conditions (such as changes in humidity, temperature, pressure and AC voltage polarity reversal) that may affect the level of discharge current in the insulators 10a-10c, and hence effect the level of deterioration. The rate of change of the phase voltages (dV/dt) may then be altered based on the operating conditions so as to maintain the discharge current in the insulators 10a-10c (and hence insulator deterioration) at acceptable levels. For example, the motor drive system may be employed in an aircraft or other aerospace systems, where significant changes in operating condition such as pressure, humidity and temperature occur. Embodiments of the present disclosure allow for a more versatile system as compared to, for example, open loop or fixed control systems.

Various embodiments also do not limit the performance of the motor drive when there is no risk, or a low level, of discharge current.

The motor drive system described herein may be used with high voltage signals. Alternatively, or additionally, the motor drive system described herein may be used with an integrated motor drive, e.g. where the motor and drive system are integrated. For example, the length of wire connecting the drive and motor may be significantly smaller than the maximum wavelength of a reflected wave caused by the rate of change of the phase voltages (dV/dt), e.g. a system with drive cables less than 10 meters long. However, other embodiments may use relatively long motor drive cables.

The motor system described herein may be used to drive an actuator, e.g. in an aerospace system.

Although the present disclosure has been described with reference to various embodiments, it will be understood by those skilled in the art that various changes in form and detail may be made without departing from the scope of the invention as set forth in the accompanying claims.

Although embodiments have been described that relate to motors and motor windings, the concept disclosed herein may be employed to reduce deterioration in the insulator(s) of an electrical conductor(s) in devices other than motors. Accordingly, embodiments are contemplated that relate to systems, other than motor systems, that include electrical conductors (e.g. wire windings) and associated insulators. Such embodiments are configured to vary the voltage applied to the electrical conductor, e.g. by using a switch/gate such as a semiconductor switch/gate. For example, embodiments relate to a power converter with one or more high frequency transformer or inductor. In these embodiments, high dV/dt pulses are applied in a corresponding manner to described above in the motor drive system.

The invention claimed is:
1. A system comprising:
   a discharge sensor configured to measure a parameter indicative of an electrical current in an electrical insulator of an electrical conductor; and
   a voltage controller for being connected to the discharge sensor for controlling a voltage signal applied to the electrical conductor based on a value of the parameter measured by the discharge sensor;

wherein the voltage controller is configured to control the rate of change of amplitude of the voltage signal applied to the electrical conductor with time (dV/dt) based on the value of the parameter measured by the discharge sensor: and wherein the voltage controller is configured to decrease said rate (dV/dt) if the value of the parameter measured by the discharge sensor is above a first set-point value and/or to increase said rate (dV/dt) if the value of the parameter measured by the discharge sensor is below a second set-point value.

2. The system of claim 1, comprising an environment sensor for sensing one or more parameters of the environment in which the electrical insulator is located; wherein the system is configured to set said first and/or second set-point value based on the value of the one or more parameters of the environment.

3. The system of claim 2, wherein the one or more parameters of the environment is one or more of: pressure, temperature and humidity.

4. The system of claim 2, comprising a dV/dt sensor arranged and configured to determine the rate (dV/dt) output from the voltage controller to the electrical conductor and generate a feedback signal in response thereto, wherein the feedback signal is fed back to the voltage controller for regulating the rate (dV/dt) of the voltage output to the electrical conductor.

5. The system of claim 4, wherein the voltage controller comprises a signal limiter for limiting the rate (dV/dt) to be between a minimum non-zero threshold value and/or a maximum threshold value.

6. The system of claim 1, wherein the voltage controller comprises an output connected to the electrical conductor, a first switch for connecting a first DC voltage terminal to the output when closed, and a second switch for connecting a second DC voltage terminal to the output when closed; wherein the voltage controller is configured to alternately open and close each of the first and second switches for providing an AC voltage signal to said output and winding.

7. The system of claim 6, wherein the first switch and/or second switch comprises a transistor that is opened and closed by varying a switching voltage applied to the transistor; and wherein the voltage controller is configured to vary the rate at which the switching voltage increases or decreases during opening or closing of the switch as a function of time based on the electrical value of the parameter measured by the discharge sensor.

8. The system of claim 6, wherein the voltage controller comprises a signal limiter for limiting the rate (dV/dt) to be at or above a minimum non-zero threshold value; the system comprising a temperature sensor for sensing a temperature of the first and/or second switch in the voltage controller, or a surrounding environment, and being configured to vary the minimum threshold value based on the sensed temperature.

9. The system of claim 6, wherein the voltage controller is configured to control the rate of change of amplitude of the voltage signal applied to the electrical conductor with time (dV/dt) based on the value of the parameter measured by the discharge sensor; wherein the system comprises a temperature sensor for sensing a temperature of the first and/or second switch in the voltage controller, or a surrounding environment, and wherein the system is configured to prevent the rate (dV/dt) being reduced if said temperature exceeds a predetermined maximum value.

10. The system of claim 1, comprising: the An assembly comprising an electrical conductor and the electrical insulator for electrically insulating the electrical conductor, wherein the discharge sensor is arranged in, on or proximate the electrical insulator.

11. A motor or actuator comprising the assembly system of claim 1.

12. A method of installing the system of claim 1, comprising: arranging the discharge sensor in, on or proximate the electrical insulator of an electrical conductor; and connecting the voltage controller to the discharge sensor.

13. A motor system comprising:
an electrical conductor in the form of a coil or winding;
an electrical insulator insulating the electrical conductor;
a discharge sensor arranged and configured to measure a parameter indicative of an electrical current in the insulator; and
a voltage controller for controlling a voltage signal applied to the electrical conductor based on a value of the parameter measured by the discharge sensor;
wherein the voltage controller is configured to control the rate of change of amplitude of the voltage signal applied to the electrical conductor with time (dV/dt) based on the value of the parameter measured by the discharge sensor: and
wherein the voltage controller is configured to decrease said rate (dV/dt) if the value of the parameter measured by the discharge sensor is above a first set-point value and/or to increase said rate (dV/dt) if the value of the parameter measured by the discharge sensor is below a second set-point value.

* * * * *